United States Patent [19]
Adachi

[11] Patent Number: 6,043,512
[45] Date of Patent: Mar. 28, 2000

[54] THIN FILM SEMICONDUCTOR DEVICE AND METHOD FOR PRODUCING THE SAME

[75] Inventor: Masahiro Adachi, Nara, Japan

[73] Assignee: Sharp Kaubushiki Kaisha, Osaka, Japan

[21] Appl. No.: 08/925,000

[22] Filed: Sep. 5, 1997

[30] Foreign Application Priority Data

Sep. 6, 1996 [JP] Japan ..................................... 8-237046

[51] Int. Cl.[7] .......................... H01L 29/78; H01L 21/236
[52] U.S. Cl. .................................. 257/66; 257/65; 257/57; 257/59; 257/347; 438/158; 438/159; 438/160
[58] Field of Search .................................. 257/66, 65, 57, 257/59, 347; 438/158, 159, 160

[56] References Cited

U.S. PATENT DOCUMENTS 5,821,559  10/1998  Yamazaki et al. ........................ 257/66

FOREIGN PATENT DOCUMENTS

| | | | |
|---|---|---|---|
| 003502911 | 8/1985 | Germany | 257/66 |
| 364032678 | 2/1989 | Japan | 257/66 |
| 6-29321 | 2/1994 | Japan . | |
| 6-34997 | 2/1994 | Japan . | |
| 6-132306 | 5/1994 | Japan . | |
| 6-291034 | 10/1994 | Japan . | |

*Primary Examiner*—Leo P. Picard
*Assistant Examiner*—Hung Van Duong
*Attorney, Agent, or Firm*—Nixon & Vanderhye P.C.

[57] ABSTRACT

A thin semiconductor film device according to the present invention includes an insulative substrate, a metal layer formed on the insulative substrate, and a metal oxide layer formed on the metal layer. The metal oxide layer is obtained from anodization of the metal layer. In a preferred embodiment, an insulation film of silicon oxide or silicon nitride is formed on the metal oxide layer, and a semiconductor layer obtained by crystallizing the amorphous silicon layer is formed on the insulation film.

7 Claims, 2 Drawing Sheets

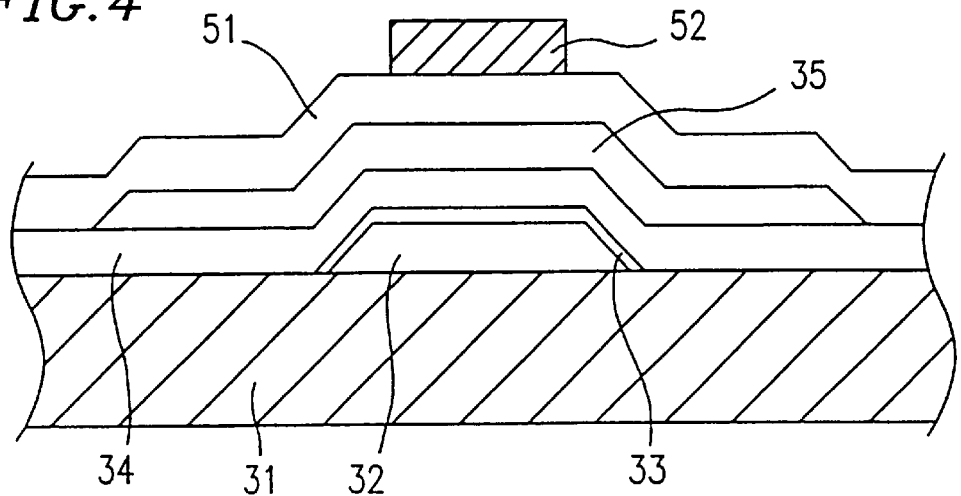
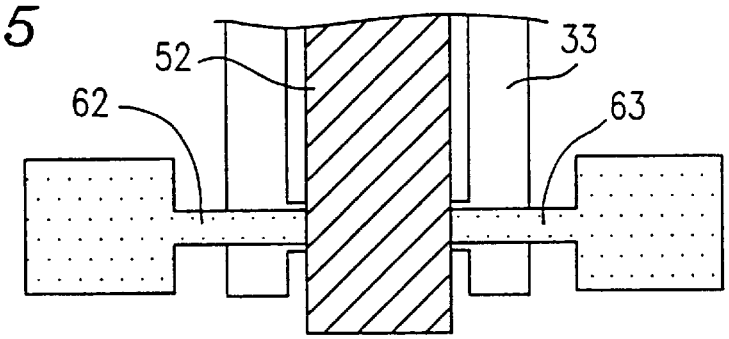
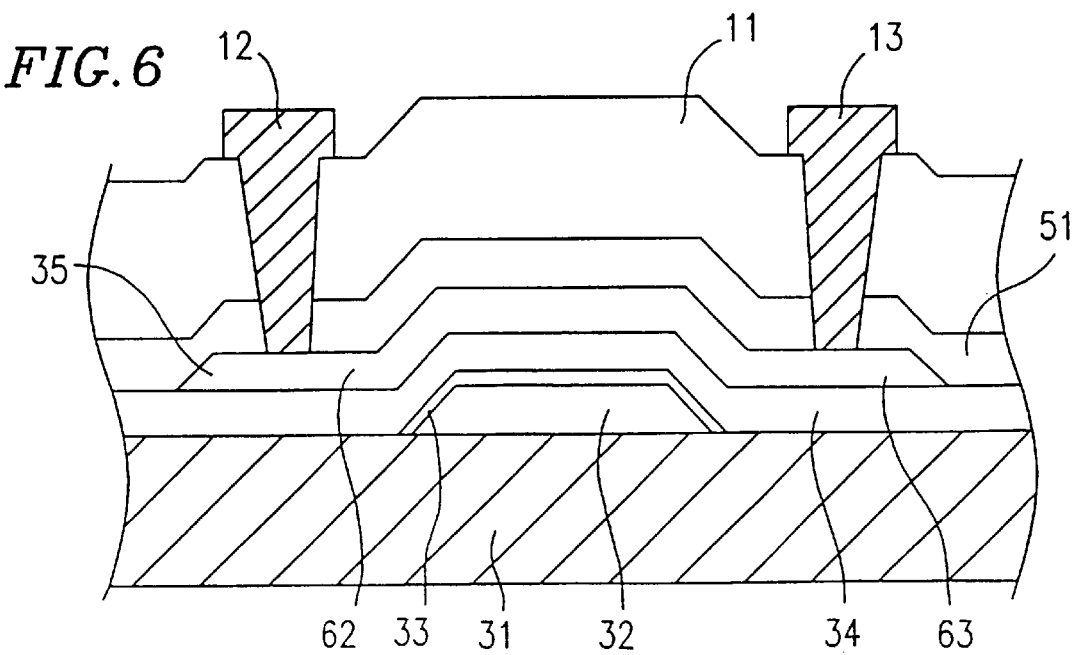

THIN FILM SEMICONDUCTOR DEVICE AND METHOD FOR PRODUCING THE SAME

BACKGROUND OF THE INVENTION

1. Field of the Invention

The present invention relates to a thin film semiconductor device (e.g., a field effect transistor or "FET") for use as a switching element to be provided on an insulative substrate (e.g., a glass substrate of an active matrix type liquid crystal display device) corresponding to each pixel of a display device, or as an element of a liquid crystal driving circuit for driving the respective pixels; and a method for producing the same. In particular, the present invention relates to a thin film semiconductor device incorporating an active layer composed essentially of polycrystalline silicon or crystalline silicon formed by laser annealing; and a method for producing the same.

2. Description of the Related Art

Conventionally, thin film transistors (hereinafter referred to as "TFTs") are known as one example of thin film semiconductor devices incorporating an active layer composed essentially of polycrystalline silicon. A TFT is typically produced by irradiating an amorphous silicon layer or a polycrystalline silicon layer with a laser beam so as to thermally melt the amorphous or polycrystalline silicon layer, and subsequently cooling the melted layer so as to allow it to recrystallize.

However, the conventional method often results in a crystal layer including non-uniform crystal grain sizes, and/or a large number of grain boundaries may occur in the resultant crystal layer. A TFT incorporating such a crystal layer is likely to have insufficient transistor characteristics. A liquid crystal display device incorporating such transistors would generally have insufficient display quality.

On the other hand, the formation of grain boundaries at least partially depends on the conditions for the recrystallization of the melted silicon. In particular, grain boundaries are known to most likely occur in regions having a non-uniform temperature distribution (for example, different melt temperatures are observed in the center of a laser beam spot and the peripheral portions thereof). Therefore, as one method for overcoming the above problem, it has been desired to perform recrystallization while maintaining the temperature distribution as uniform as possible in the regions which are require to be recrystallized. For example, a method has been proposed for controlling the temperature of the silicon layer in both a step of melting the silicon by laser beam irradiation and a step of cooling the silicon layer. Both of the following two conditions are supposed to be satisfied:

1) the thermal distribution of the still-melted silicon obtained by a melt process with laser beam irradiation must become uniform; and 2) the silicon temperature must be gradually lowered when recrystallizing the silicon in a melt state, thereby obtaining relatively large grain diameters.

However, it has been difficult to simultaneously satisfy the above two conditions for the following reasons. In terms of making the thermal distribution of the melted silicon uniform, a substrate having high thermal conductivity is generally preferable (so as to achieve sufficient thermal draining toward layers underlying the silicon layer). On the other hand, in terms of controlling the cooling speed of the melted silicon, a substrate having high thermal conductivity is generally unpreferable because the radiation from the silicon should be minimized.

A few examples of conventional thin film semiconductor devices will be described below.

Japanese Laid-Open Patent Publication No. 6-34997 discloses a method in which a light-shielding layer formed of a metal having a high melt point is formed under a silicon layer, with an interlayer insulation layer interposed therebetween. According to this method, thermal draining occurs to a large extent in the vicinity of the light-shielding layer at the time of laser beam irradiation, so that a relatively uniform thermal distribution can be obtained in the vicinity of the beam spot. However, this method is disadvantageous due to the large radiation from the silicon layer, which allows the melted silicon layer to cool down relatively quickly, thereby resulting in small grain diameters and insufficient uniformity of crystal grain size.

Japanese Laid-Open Patent Publication No. 6-291034 discloses a method in which a silicon oxide layer and a heating layer of Ge or Mo are in turn formed, the heating layers being irradiated with a second laser beam having a different wavelength than that of the laser beam for annealing the silicon layer, thereby providing an effective thermal processing for the silicon layer. According to this method, the heating layers are additionally formed, which are subjected to further laser irradiation, so that this method may be effective in terms of controlling the thermal distribution of the silicon layer in a melt state and the cooling rate of the silicon layer from the melt state. However, this method may be disadvantageous due to the complex conditions required for the laser irradiations with different wavelengths.

Japanese Laid-Open Patent Publication No. 6-29321 discloses a method in which a cavity is formed under a silicon layer. According to this method, the cavity functions to control the radiation from the silicon layer (which has absorbed laser energy) into the insulative substrate, thereby effectively increasing the resultant grain diameters. However, this method results in a non-uniform thermal distribution of the melted silicon layer due to the decreased thermal conduction from the silicon layer.

Japanese Laid-Open Patent Publication No. 6-132306 discloses a method in which a thin silicon oxide film is formed under a silicon layer, a thin silicon nitride film being further formed under the thin silicon oxide film. According to this method, the relatively low thermal conductivity of the silicon oxide layer prevents the temperature of the melted silicon (which was melted by laser irradiation) from rapidly decreasing, so that the grain diameters may be somewhat increased. However, as in the case of Japanese Laid-Open Patent Publication No. 6-29321, this method results in a non-uniform thermal distribution of the melted silicon layer due to decreased thermal conduction from the silicon layer.

SUMMARY OF THE INVENTION

A thin semiconductor film device according to the present invention includes: a metal oxide layer provided under a semiconductor layer; and a metal layer provided under the metal oxide layer, wherein the semiconductor layer comprises a thin film of polycrystalline or crystalline silicon, the metal layer comprising a metal which the metal oxide layer is composed essentially of.

In one embodiment of the invention, the metal oxide layer is formed by anodizing the metal layer.

In another embodiment of the invention, the metal oxide layer is formed by a physical or chemical deposition process.

In still another embodiment of the invention, the metal which the metal oxide layer is composed essentially of is selected from the group consisting of tantalum and aluminum.

In still another embodiment of the invention, the thin semiconductor film device includes a region where the semiconductor layer is not present above the metal oxide layer.

In still another embodiment of the invention, the semiconductor layer includes a source, a drain, and a channel region; and the size of the region where the semiconductor layer is not present above the metal oxide layer is smaller in the vicinity of a junction region between the source and the channel region and a junction region between the drain and the channel region than in the vicinity of the source and the drain.

In still another embodiment of the invention, the thin semiconductor film device further includes an insulation layer and a gate electrode above the semiconductor layer, the metal layer intercepting light entering from below the semiconductor layer.

In still another embodiment of the invention, the thin semiconductor film device further includes an insulation layer between the semiconductor layer and the underlying metal oxide layer, the insulation layer comprising a material selected from the group consisting of silicon oxide and silicon nitride.

In still another embodiment of the invention, the metal layer is a gate electrode and the insulation layer is a gate insulation film.

In another aspect of the invention, there is provided a method for producing the above-described thin semiconductor film device, the method including the steps of: (a) forming the semiconductor layer by recrystallizing an amorphous or polycrystalline silicon by laser annealing, or by subjecting to a heat treatment an amorphous or polycrystalline silicon; and (b) radiating at least a portion of the laser beam used for the laser annealing also on the metal oxide layer so as to heat the metal oxide layer.

In another aspect of the invention, there is provided a method for producing the above-described thin semiconductor film device, the method including the steps of: (a) forming a thin semiconductor layer of an amorphous or polycrystalline silicon on the metal oxide layer; (b) removing at least a portion of the semiconductor layer to reveal at least a portion of the metal oxide layer, thereby creating a region where the semiconductor layer is not present; and (c) radiating at least a laser light beam from above the semiconductor layer to form a thin semiconductor layer of a polycrystalline or crystalline silicon.

Thus, according to the present invention, a metal oxide layer is formed under a silicon layer to be subjected to laser irradiation, with a metal layer being further formed under the metal oxide layer. The metal oxide layer receives at least a portion of the laser light so as to be heated thereby. This adequately reduces the rate of cooling of the silicon which has been melted due to irradiation by the laser. Furthermore, the metal layer (which has excellent thermal conductivity) underlying the metal oxide layer provides a highly uniform thermal distribution for the melted silicon. Suitable materials for the silicon layer include amorphous silicons and polycrystalline silicons.

In regions where there is no silicon layer present upon the metal oxide layer, the metal oxide layer is irradiated with the laser light directly, i.e., without being intercepted by the silicon layer, and therefore is adequately heated. By creating such regions lacking any overlying silicon layer upon the metal oxide layer as necessary, the thermal distribution of the silicon in a melt state can be made uniform, and the cooling rate of the silicon layer from melt state can be controlled as desired.

Specifically, as will be described in an example of the invention to be discussed later (FIG. 3), the region where the metal oxide layer is not covered by an overlying silicon layer can be designed so as to be smaller in size in the vicinity of a junction region between a source and a channel region and a junction region between a drain and a channel region of the transistor, than in the vicinity of the source and the drain. As a result, less heat is retained by the metal oxide layer in the vicinity of the junction region between the source and the channel region and the junction region between the drain and the channel region, so that the recrystallization from the melt state of the silicon layer is enhanced in these conjunction regions. Accordingly, the crystal growth of the silicon layer is effectively controlled to proceed from the above-mentioned junction regions toward the source and the drain, where crystal defects are prevented from occurring in a high concentration at these junction regions.

As the metal oxide layer, materials such as aluminum oxide or tantalum oxide, which absorb excimer laser light in the ultraviolet (UV) region, can be suitably used. For example, Thin Solid Films, vol. 145, pp. 39–49 (1986) M.METIKOS-HUKOVIC and M.CERAJ-CERIC discloses that tantalum oxide formed through anodization has photo-conductivity at least in a spectrum range from 220 nm to 340 nm. For example, tantalum oxide absorbs excimer laser light having a wavelength of 248 nm (KrF) and 308 nm (XeCl). Aluminum oxide absorbs about 3% at 300 nm and about 10% at 200 nm (sapphire laser source). Thus, the excimer laser light is effectively absorbed by such materials.

These metal oxide layers may be formed by anodizing a metal layer composed essentially of aluminum or tantalum. Adopting anodization for the metal oxide layer formation advantageously reduces the number of production steps as compared with a procedure including forming a metal oxide film by a deposition method such as chemical or physical deposition, and then patterning the metal oxide film by photolithography.

Furthermore, the metal layer and the metal oxide layer can also function as light-shielding films for intercepting light entering the substrate from its bottom face in an FET of a top-gate structure including an active layer of silicon and a gate insulation film and a gate electrode formed upon the silicon active layer.

Moreover, the metal layer and the metal oxide layer can similarly function as a gate electrode in an FET of a bottom-gate structure including an active layer of silicon and a gate insulation film and a gate electrode formed under the silicon active layer.

As described above, by providing a metal oxide layer and a metal layer under a semiconductor pattern of a silicon layer, a uniform thermal distribution can be maintained in the melted silicon layer during laser irradiation, and the thermal distribution of the layer can be adequately controlled in the cooling and recrystallization process. As a result, the uniformity of the silicon crystals improves, and a semiconductor layer of a polycrystalline silicon including grains of substantially uniform diameters or a semiconductor layer of a monocrystalline silicon including minute crystal grains can be obtained.

As a result, a thin semiconductor film device (e.g., an FET) incorporating the silicon semiconductor layer of the invention has sufficiently improved characteristics. Furthermore, the respective semiconductor layers in a number of such thin semiconductor film devices have substantially identical crystallinity, so that a number of such thin semiconductor film devices can be produced with little inter-product variation. Therefore, a semiconductor circuit (e.g., a monolithic driver of a liquid crystal display device) incorporating a number of such thin semiconductor film devices would have little output variation. A driver-integrated display incorporating such a semiconductor circuit would have excellent display quality. In particular, the concentration of crystal defects occurring at the junction regions between the channel and the source or the drain can be reduced, whereby the leak current of the transistor is reduced so that the power consumption of the circuit is also reduced.

Thus, the thin semiconductor film device according to the present invention and the method for producing the same are of great industrial applicability.

Thus, the invention described herein makes possible the advantages of (1) providing a thin film semiconductor device having excellent display characteristics, obtained by making the thermal distribution of the silicon which has been melted by laser beam irradiation uniform and ensuring that the temperature of the melted silicon gradually decreases so that the recrystallization of the silicon is adequately retarded, whereby the occurrence of crystal defects may be minimized in a region; and (2) providing a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 4 is a cross-sectional view illustrating a process for producing the FET according to Example 1 of the present invention.

FIG. 5 is a plan view illustrating a process for producing the FET according to Example 1 of the present invention.

FIG. 6 is a cross-sectional view illustrating the structure of an FET according to Example 2 of the present invention.

DESCRIPTION OF THE PREFERRED EMBODIMENTS

Hereinafter, the present invention will be described by way of examples, with reference to the accompanying drawings. However, the examples are to be interpreted as illustrative only and not restrictive of the scope of the invention in any way.

EXAMPLE 1

Figure 1:
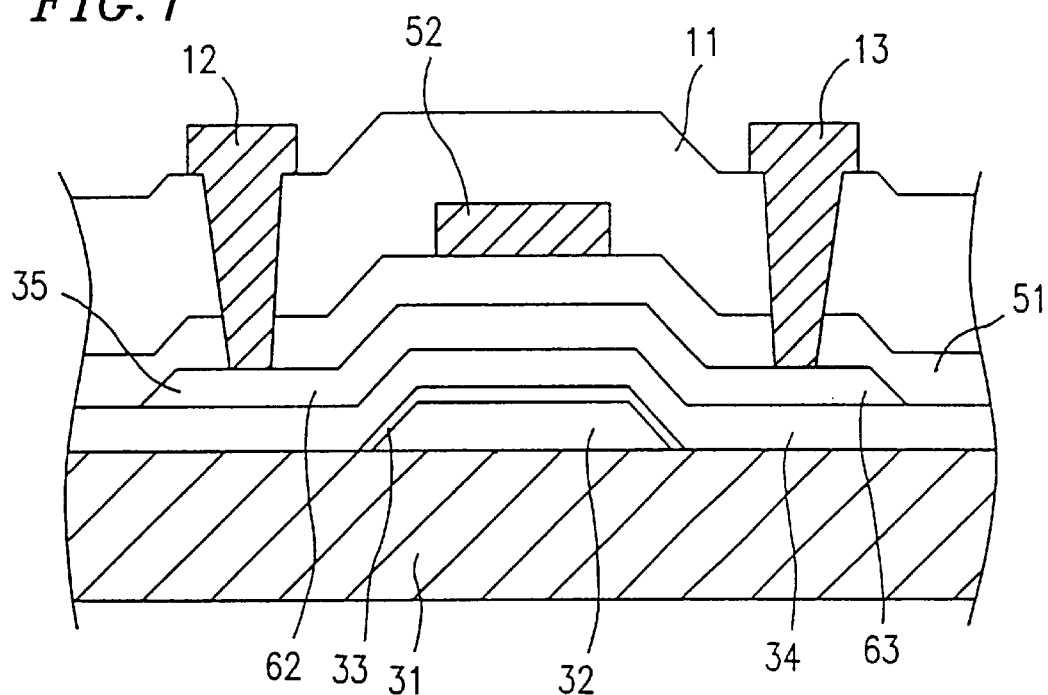
FIG. 1 is a cross-sectional view illustrating the structure of an FET according to Example 1 of the present invention.

FIG. 1 is a cross-sectional view illustrating an FET according to Example 1 of the present invention. The FET includes a metal layer 32 of tantalum formed on an insulative substrate 31 (e.g., a glass substrate), and a metal oxide layer 33 formed on the metal layer 32, the metal oxide layer 33 being obtained by anodizing the tantalum of the metal layer 32. Aluminum is an alternative preferable material for the metal layer 32 other than tantalum. In the case where the metal layer 32 is composed of aluminum, it is preferable that the metal oxide layer 33 include aluminum oxide (which results from oxidation of the aluminum of the metal layer 32).

An insulation film 34 (of silicon oxide or silicon nitride, etc.) is formed so as to have a predetermined pattern covering a part or the whole of the metal oxide layer 33 and the upper face of the substrate 31. A predetermined pattern of a semiconductor layer 35 (obtained by crystallizing an amorphous silicon layer) is formed on the insulation film 34. As shown in FIG. 1, one of the end portions of the semiconductor layer 35 defines a source 62, the other end portion defining a drain 63.

A gate insulation film 51 (of silicon oxide, etc.) is formed so as to have a predetermined pattern covering the semiconductor substrate 35 and the upper face of the substrate 31. A gate electrode 52 (of aluminum silicide, etc.) is formed on the gate insulation film 51. An interlayer insulation film 11 (of silicon oxide, etc.) is formed so as to have a predetermined pattern covering the gate insulation film 51 (and the gate electrode 52) and the upper face of the substrate 31. Contact holes are respectively provided at portions of the interlayer insulation film 11 and the gate insulation film 51 located above the source 62 and the drain 63 of the semiconductor layer 35. A source electrode 12 and a drain electrode 13 (of an aluminum-titanium alloy, etc.) are formed on the interlayer insulation film 11. The source electrode 12 is electrically connected to the source 62 via the corresponding contact hole; the drain electrode 13 is electrically connected to the drain 63 via the corresponding contact hole.

Hereinafter, a process for producing the FET according to the present invention will be described.

Figure 2:
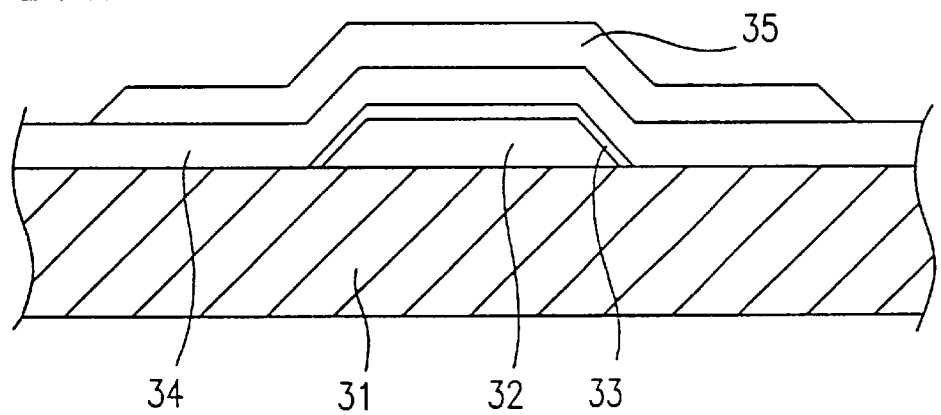
FIG. 2 is a cross-sectional view illustrating a process for producing the FET according to Example 1 of the present invention.

A tantalum film (thickness: 200 nm) is formed by sputtering on a ground substrate (on which a plurality of patterns are formed at intervals of several millimeters) prior to being divided into unit substrates. This film is patterned by dry etching using $CCl_4$ gas, whereby the metal layer 32 is obtained (FIG. 2).

Next, the ground substrate is soaked in an electrolyte bath (e.g., ammonium tartrate), and a positive voltage of about several dozen volts is applied to the metal layer 32 pattern, thereby forming the metal oxide layer 33 of tantalum oxide (thickness: several dozen nanometers). Alternatively, the metal oxide layer 33 may be formed by: forming a tantalum film on the substrate; anodizing the entire surface of the tantalum film; and patterning the tantalum oxide film by dry etching using $O_2$ and $CCl_4$ gases. Aluminum may also be preferably used instead of tantalum.

Next, the insulation film 34 of silicon oxide or silicon nitride is formed by a plasma CVD (chemical vapor deposition) method or the like, and subsequently patterned.

Figure 3:
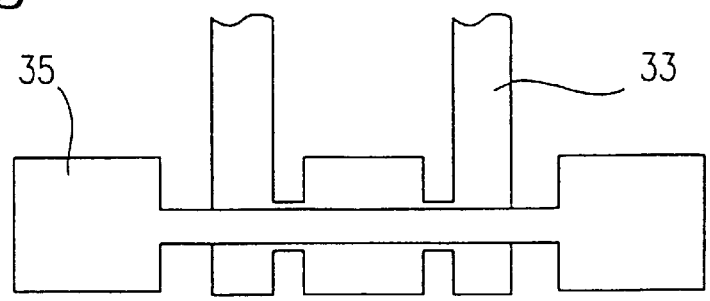
FIG. 3 is a plan view illustrating a process for producing the FET according to Example 1 of the present invention.

Then, an amorphous silicon layer 35 is formed on the insulation film 34 by a plasma CVD method, and subsequently patterned. As seen from FIG. 3, the pattern of the amorphous silicon layer 35 includes regions where it is smaller than the already-formed metal oxide pattern 33 of tantalum oxide. Thus, the metal oxide layer 33 is exposed from under the amorphous silicon layer 35 (insulation film 34) in such regions.

Next, pulse laser light is radiated from above the substrate, using a KrF excimer laser (wavelength: 248 nm) or a XeCl excimer laser (wavelength: 308 nm). The pulse laser light is absorbed by the amorphous silicon layer 35 so as to heat and at least partially melt the amorphous silicon layer 35. At this time, the metal oxide layer 33 underlying the amorphous silicon layer 35 also absorbs at least a portion of the laser light so as to be heated thereby. Note that the metal oxide layer 33 is heated to a higher temperature in regions not covered by the amorphous silicon layer 35 than in other regions (where a large portion of the laser light is absorbed into the silicon layer 35). As a result, the uniform temperature distribution of the amorphous silicon layer 35 in the melt state can be maintained because the amorphous silicon layer 35 has sufficient thermal diffusion due to the metal layer 32 (formed of tantalum, which is an excellent conductor of heat) under the metal oxide layer 33, which in turn is formed under the amorphous silicon layer 35.

After completing laser irradiation, the amorphous silicon layer 35 and the metal oxide layer 33 are cooled so as to recrystallize the silicon. Since the metal oxide layer 33 has a temperature distribution in accordance with the presence/absence of the amorphous silicon layer 35, the cooling rate of the amorphous silicon layer 35 also has a distribution as a whole, in accordance with the presence/absence of the amorphous silicon layer 35. According to the present example, the temperature is generally higher in regions outside the amorphous silicon layer 35, resulting in a lower cooling rate therein. Therefore, the recrystallization of the silicon layer 35 begins in the central portion of the silicon layer 35 pattern, with the crystal growth occurring toward the outer peripheral portions of the silicon layer 35 pattern. As a result, crystal defects, if any, will be mainly formed in the outer peripheral portions of the semiconductor layer 35 pattern (which is the recrystallized silicon), while the central portion of the semiconductor layer 35 enjoys a relatively low of concentration crystal defects concentration.

Next, as shown in FIG. 4, silicon oxide is formed by a plasma CVD method to define the gate insulation film 51, and aluminum silicide is formed by sputtering on the gate insulation film 51 to form the gate electrode 52.

Next, phosphorous ions are implanted from above the gate electrode 52 using an ion doping apparatus. As shown in FIG. 5, the source 62 and the drain 63 are formed in the semiconductor layer 35 by utilizing the gate electrode 52 as a mask. The source 62 and drain 63 define $n^+$ regions of a self-alignment structure.

Next, as shown in FIG. 1, a silicon oxide layer is formed by a plasma CVD method to define the interlayer film 11. Then, contact holes are opened above the source 62 and the drain 63.

Next, an aluminum-titanium alloy film is formed by sputtering, and patterned into the source electrode 12 and the drain electrode 13. As a result, an FET having the top-gate structure as shown in FIG. 1 is obtained.

In the FET according to the present invention having the above-described structure, the metal layer 32 also functions as a light-shielding layer for preventing light from entering the semiconductor layer 35 through the substrate 31, thereby minimizing any increase in the leak current of the transistor, etc.

As described earlier, the region where the metal oxide layer 33 is not covered by the overlying silicon layer 35 is smaller in size in the vicinity of a junction region between the source 62 and the channel region and a junction region between the drain 63 and the channel region, than in the vicinity of the source 62 and the drain 63 of the transistor. As a result, less heat is retained by the metal oxide layer 33 in the vicinity of the junction region between the source 62 and the channel region and the junction region between the drain 63 and the channel region, so that the recrystallization from the melt state of the silicon layer 35 is enhanced in these conjunction regions. Accordingly, the crystal growth of the silicon layer 35 is effectively controlled to proceed from the above-mentioned junction regions toward the source 62 and the drain 63, where crystal defects are prevented from occurring at a high concentration in these junction regions, and so on.

EXAMPLE 2

FIG. 6 is a cross-sectional view illustrating an FET according to Example 2 of the present invention, which is a bottom-gate type TFT incorporating a metal layer 32 (of tantalum, etc.) functioning as a gate electrode.

The production process for the TFT of the present example is similar to the production process for the FET of Example 1 up to the formation of the gate insulation film 51. Next, without forming the aluminum gate electrode 52 in the FET of Example 1, a predetermined resist pattern is formed, followed by an ion implantation, and a source 62 and a drain 63 are formed in a semiconductor layer 35. Then, the resist pattern is removed. Next, in the same manner as in Example 1, an interlayer insulation film 11, contact holes, a source electrode 12, and a drain electrode 13 are formed, whereby the desired TFT according to the present example is obtained.

The materials for forming the semiconductor layer may include but are not limited to amorphous silicons, polycrystalline silicons, and the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin semiconductor film device comprising:

a metal oxide layer provided under a semiconductor layer; and a metal layer provided under the metal oxide layer, wherein the semiconductor layer includes a thin film of polycrystalline or crystalline silicon, the metal layer including a metal which the metal oxide layer is composed essentially of;

wherein the thin semiconductor film device includes a region where the semiconductor layer is not present above the metal oxide layer;

wherein the semiconductor layer includes a source, a drain, and a channel region; and the size of the region where the semiconductor layer is not present above the metal oxide layer is smaller in vicinity of a junction region between the source and the channel region and a junction region between the drain and the channel region than in vicinity of the source and the drain.

2. A thin semiconductor film device according to claim 1, wherein the metal oxide layer is formed by anodizing the metal layer.

3. A thin semiconductor film device according to claim 1, wherein the metal oxide layer is formed by a physical or chemical deposition process.

4. A thin semiconductor film device according to claim 1, wherein the metal which the metal oxide layer is composed essentially of is selected from the group consisting of tantalum and aluminum.

5. A thin semiconductor film device according to claim 1, further comprising an insulation layer and a gate electrode above the semiconductor layer, the metal layer intercepting light entering from below the semiconductor layer.

6. A thin semiconductor film device according to claim 1, further comprising an insulation layer between the semiconductor layer and the underlying metal oxide layer, the insulation layer including a material selected from the group consisting of silicon oxide and silicon nitride.

7. A thin semiconductor film device according to claim 6, wherein the metal layer is a gate electrode and the insulation layer is a gate insulation film.

* * * * *